United States Patent [19]
Kamimura et al.

[11] 3,968,451
[45] July 6, 1976

[54] TRANSISTOR AMPLIFIER

[75] Inventors: Kazuhiko Kamimura, Yokohama; Tadao Yoshida, Tokyo, both of Japan

[73] Assignee: Sony Corporation, Tokyo, Japan

[22] Filed: May 16, 1975

[21] Appl. No.: 578,194

[30] Foreign Application Priority Data
May 21, 1974 Japan.................................. 49-57006

[52] U.S. Cl............................... 330/22; 330/13; 330/15; 330/17; 330/30 D; 330/35; 330/149
[51] Int. Cl.²........................................... H03F 3/16
[58] Field of Search ............... 330/35, 149, 40, 22, 330/13, 17, 30 D, 15

[56] References Cited
UNITED STATES PATENTS
3,693,107  9/1972  Long................................. 330/22 X Primary Examiner—James B. Mullins
Attorney, Agent, or Firm—Lewis H. Eslinger; Alvin Sinderbrand

[57] ABSTRACT

A transistor amplifier comprised of a transistor supplied with a first operating voltage and a field effect transistor having triode-type dynamic characteristics and supplied with a second operating voltage. The gate electrode of the field effect transistor is coupled to the transistor collector. In order to stabilize the field effect transistor bias current in the event of fluctuations in the second operating voltage, a voltage control circuit is responsive to such fluctuations to alter the first operating voltage so as to vary the gate voltage applied to the field effect transistor in a direction to stabilize the bias current.

21 Claims, 8 Drawing Figures

FIG. 8

TRANSISTOR AMPLIFIER

BACKGROUND OF THE INVENTION

This invention relates to a transistor amplifier and, more particularly, to a transistor amplifier comprised of a field effect transistor having triode-type dynamic characteristics wherein the DC bias current flowing therethrough is stabilized, notwithstanding voltage fluctuations in the power supply.

The use of a field effect transistor (FET) having triode-type dynamic characteristics offers many advantages which cannot be obtained from conventional FET's which have pentode-type dynamic characteristics. For example, harmonic distortion is reduced and switching characteristics are improved for the FET having triode-type dynamic characteristics. Also, this type of FET has a greatly improved linearity function. Consequently, the FET having triode-type dynamic characteristics finds ready application in high fidelity audio equipment, especially as an audio output amplifier.

One problem of such an FET having triode-type dynamic characteristics is that the DC bias current which flows through the drain-source circuit will be subjected to variations if the operating potential applied to the FET by the voltage supply exhibits fluctuations. In the application of audio amplifier, large currents are often required, resulting in significant variations in the voltage supply. The consequential bias current variations can result in undesirable distortion in the amplified output of the FET.

One solution to this problem has been proposed in U.S. Pat. application Ser. No. 508,836, filed on Sept. 24, 1974, and assigned to the same assignee as the instant invention. As previously proposed, a bias circuit is connected to the gate electrode of the FET for applying a suitable bias voltage thereto. This bias circuit includes a DC compensating circuit which serves to vary the FET gate bias in response to fluctuations in the operating potential supplied by a power supply. In particular, the change in the gate bias is intended to be directly proportional to the change in operating potential with a proportionality factor related to the amplification constant of the FET.

Although this arrangement offers satisfactory results in most instances, it is desirable to simplify the requisite circuitry. Also, it is preferred to have the change in the gate bias more closely related to the fluctuations in the FET power supply. Accordingly, another proposal to stabilize the DC bias current of the FET is described is copending Application Ser. No. 577,678. The present invention is directed to a still further arrangement for achieving FET bias current stabilization.

OBJECTS OF THE INVENTION

Therefore, it is an object of the present invention to provide an improved transistor amplifier including an FET having triode-type dynamic characteristics wherein the DC bias current flowing through the FET is stabilized, notwithstanding voltage fluctuations in the FET power supply.

Another object of this invention is to provide an improved transistor amplifier of simple construction and including a bias-stabilized FET having triode-type characteristics.

Another object of this invention is to provide an improved amplifier including an FET having triode-type characteristics disposed in drain follower configuration and exhibiting a stabilized DC bias current.

Yet another object of this invention is to provide an improved amplifier including an FET having triode-type characteristics and further including a simple compensating circuit for preventing amplifier output distortion caused by fluctuations in the operating potential applied to the FET.

A still further object of the present invention is to provide a transistor amplifier of relatively simple circuit configuration which is readily adapted for use as a high quality audio power amplifier.

Various other objects and advantages of the present invention will become apparent from the ensuing detailed description, and the novel features will be particularly pointed out in the appended claims.

SUMMARY OF THE INVENTION

In accordance with the present invention, an improved transistor amplifier is provided including a transistor having an input electrode and a pair of output electrodes connected to receive a first operating voltage and an FET having triode-type characteristics, the gate electrode of the FET being connected to one of the transistor output electrodes; the source-drain circuit of the FET is connected to receive a second operating voltage; and a voltage control circuit is responsive to fluctuations in the second operating voltage to alter the first operating voltage so as to vary the gate voltage applied to the FET in a direction to stabilize the DC bias current flowing through the FET source-drain circuit in the presence of such operating voltage fluctuations.

BRIEF DESCRIPTION OF THE DRAWINGS

The following detailed description will best be understood in conjunction with the accompanying drawings in which.

DETAILED DESCRIPTION OF CERTAIN ONES OF THE PREFERRED EMBODIMENTS

Figure 1:
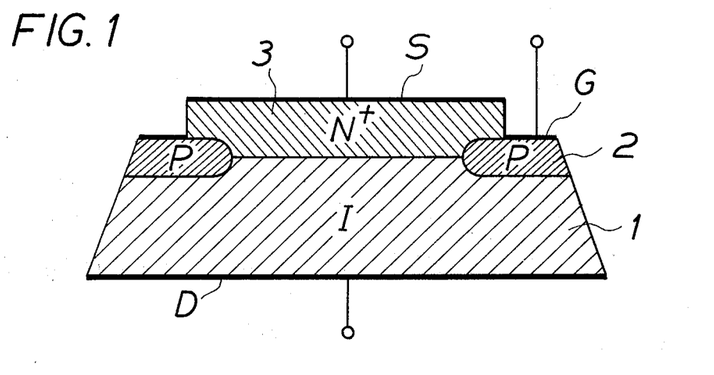
FIG. 1 is a sectional view of one embodiment of a field effect transistor having triode-type characteristics which may be used with the present invention.

Referring to the drawings, and in particular to FIG. 1, there is depicted a sectional view of one example of an FET having triode-type dynamic characteristics which may be used in the transistor amplifier in accordance with this invention. The FET is a vertical junction structure formed of an intrinsic semiconductor region 1 having low impurity concentration and high resistance, a P-type semiconductor region 2 having an annular configuration and formed on the upper portion of the intrinsic region 6, and a N-type semiconductor region 3 having high impurity concentration formed over both the annular P-type region 2 and the intrinsic region 1, as shown. The P-type region 2 may be formed by conventional selective diffusion techniques and the N-type region 3 may be formed by conventional epitaxial techniques. Of course, other methods can be used to form these regions, as desired. Respective drain D, gate G and source S electrodes are provided at the lower surface of the intrinsic region 1, an exposed portion of the P-type annular region 2 and the upper surface of the N-type region 3, respectively.

Figure 2:
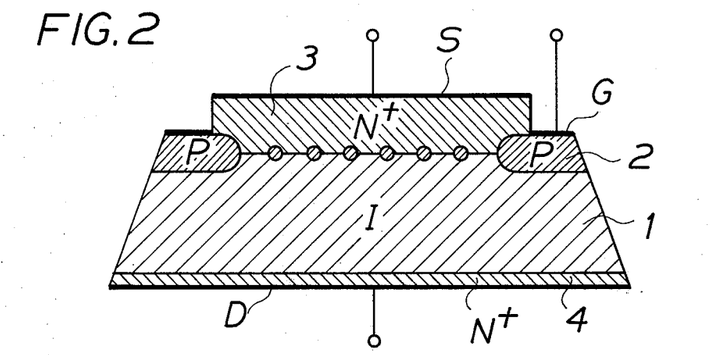
FIG. 2 is a sectional view of another embodiment of a field effect transistor which may be used with the present invention.

The vertical junction FET depicted in FIG. 1 exhibits triode-type dynamic characteristics. A preferred embodiment of such an FET is depicted in FIG. 2 wherein like reference numerals identify corresponding elements. The FIG. 2 embodiment may be thought of as being formed by a combination of plural FET's of the type shown in FIG. 1 and closely resembles the aforedescribed FIG. 1 embodiment of the FET with the added modifications that the P-type annular region 2 is formed with a mesh-type structure therewithin, as shown. Accordingly, the high impurity concentration N-type region 3 is seen to overlie both the annular and mesh-shape P-type region 2 and the intrinsic region 1, the mesh-shape defining a boundary between the intrinsic region and the overlying high impurity concentration N-type region. Furthermore, an additional N-type semiconductor region 4 having high impurity concentration is formed on the lower surface of the intrinsic semiconductor region 1, and the drain electrode D is formed thereon. The additional N-type region serves to increase the breakdown voltage between the drain and source electrodes.

The equivalent internal resistance between the source and drain electrodes is a composite resistance comprised of the resistance between the source electrode and the channel within the FET, the resistance of the channel itself and the resistance between the channel and the drain electrode. In the prior art junction FET the channel is a lateral channel having high resistance because of its narrow and long configuration. The source-to-channel resistance and the channel-to-drain resistance also are high. Consequently, the resistance of the prior art junction FET is very high. As a result of this high resistance, the prior art junction FET exhibits pentode-type dynamic characteristics and, as is apparent therefrom, the drain current becomes saturated as the drain voltage is increased.

In comparison to the aforedescribed prior art junction FET, the FET shown in FIGS. 1 and 2 is characterized by a relatively small separation between the source electrode S and the vertical channel and, additionally, the channel length itself is relatively small so that the ratio of channel width to length is larger than that of the prior art lateral channel FET. Consequently, the output resistance of the vertical junction FET depicted in FIGS. 1 and 2 is much smaller than the resistance of the prior art FET and is on the order of, for example, about 10 ohms. Accordingly, the drain current of the illustrated FET does not become saturated as the drain voltage increases. The voltage-current characteristics with respect to the drain electrode thus exhibit superior linearity over those of the prior art, thereby permitting effective use of the FET in an amplifier with high signal fidelity.

Figure 3:
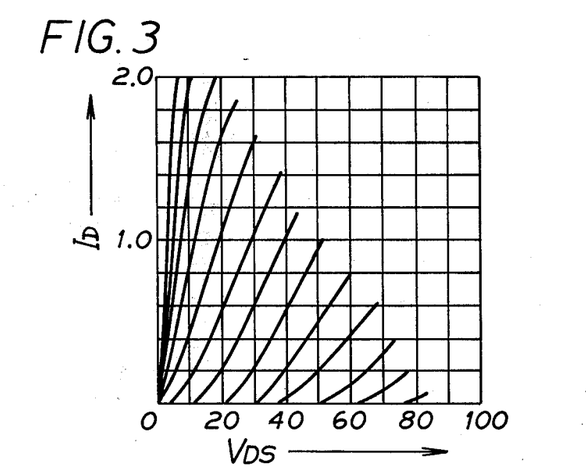
FIG. 3 is a graphical representation illustrating typical dynamic characteristics of a field effect transistor having triode-type characteristics.

An illustration of the dynamic characteristics exhibited by the FET shown in FIGS. 1 and 2 is graphically represented in FIG. 3. This graphical representation depicts the relationship between the drain current $I_D$ and the drain-to-source voltage $V_{DS}$. Each individual curve represents the current-voltage relationship for corresponding gate voltages $V_g$ wherein the gate voltage is the variable parameter. It is recognized that the characteristic curves shown in FIG. 3 are analogous to the curves which represent the dynamic characteristics of a conventional triode. Therefore, because the FET is of the type which exhibits triode-type dynamic characteristics, the output resistance is substantially constant and the FET is capable of producing a large output signal having little distortion.

Among the advantages attained by the use of the illustrated FET having triode-type dynamic characteristics is that the larger ratio of vertical channel width to channel length between the drain and source regions permits a higher drain current to flow. Another advantage is that the characteristic curves depicting the relationship between drain current and gate voltage are linear so that odd harmonic distortion is reduced. Yet another advantage is the reduction in switching distortion which is attributed to the fact that the FET does not have the storage carriers which are included in bipolar transistors. Still another advantage is the high input impedance of the FET. As a result of such input impedance, the load presented by an input source does not cause non-linear distortion. Yet a further advantage lies in the fact that, because of its low output resistance, the illustrated FET can readily drive a load which requires a relatively high damping factor. An additional advantage is that if the illustrated FET is used in a push-pull amplifier, a complementary push-pull circuit can be formed of simple circuit construction.

The conventional lateral junction FET cannot achieve the foregoing advantages, primarily because it exhibits pentode-type dynamic characteristics and thus has a very high output resistance, on the order, for example, of several megohms. Thus, with the conventional FET, as the drain voltage increases, the drain current is driven into saturation at a relatively low value of drain voltage.

Figures 4, 5:
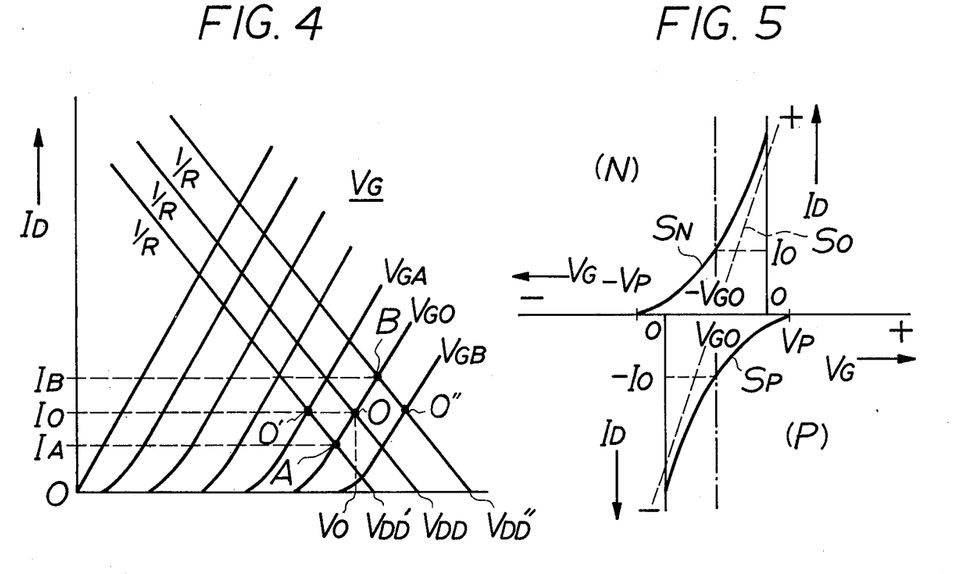
FIG. 4 is a graphical representation of field effect transistor characteristics which will be helpful in understanding the present invention.
FIG. 5 is another graphical representation of field effect transistor characteristics which will be helpful in understanding the present invention.

The affect of fluctuations in the operating potentials applied to the FET now will be described with reference to FIG. 4. The graphical representation of FIG. 4 depicts the triode-type dynamic characteristics of the FET. In addition, a load line is drawn on these characteristics, the load line having a slope, or inclination, equal to 1/R, where R represents the load impedance. If it is assumed that the operating potential supplied to the FET is equal to $V_{DD}$, then the load line drawn from this point is seen to intersect the current-voltage curve at the point o for the case where the FET gate voltage is equal to $V_{G0}$. This point can be considered to be a quiescent, or normal, operating point, resulting in a DC bias current equal to $I_0$ at the drain electrode.

Now, if the operating potential supplied to the FET is subjected to a fluctuation so as to be decreased to the value $V'_{DD}$, then the load line will correspondingly shift so as to intersect the abscissa at this lower point. Similarly, if the operating potential supplied to the drain electrode is increased to the higher value $V''_{DD}$, then the load line correspondingly shifts, as shown. In this regard, it is apparent that a negative change in the operating potential causes the load line to intersect the current-voltage characteristic curve associated with a gate voltage equal to $V_{G0}$ at the point A. This has the effect of reducing the drain bias current from its quiescent value $I_0$ to a lower value $I_A$. Similarly, in response to a positive change in the operating potential supplied to the FET drain electrode, the intersection of the load line with the $V_{G0}$ current-voltage curve now occurs at the point B, resulting in an increased drain bias current $I_B$.

This variation in the drain bias current caused by fluctuations in operating potential supplied to the FET drain electrode has the deleterious affect of producing distortions in the output of the audio amplifier. This disadvantage is accentuated for the amplifier configuration wherein N-channel and P-channel FET's having triode-type dynamic characteristics are used as a complementary push-pull audio amplifier, or in a class-AB amplifier. This can be readily appreciated when it is recognized that, in such an amplifier configuration, the N-channel and P-channel FET's are selected to have current-voltage characteristic curves with respect to the drain electrode which have matched cut-off characteristics.

The operation derived from matched complementary FET's having triode-type dynamic characteristics is graphically represented in FIG. 5. In this graphical depiction, the full line SN in the upper half of the graph represents the relationship between the drain current and the gate voltage of the N-channel FET. The full line SP in the lower half of the graph represents the relationship between the drain current and the gate voltage of the P-channel FET. If the gate voltages applied to the respective FET's are equal to $-V_{G0}$ and $+V_{G0}$, then a composite characteristic curve for the complementary FET's will effectively be as indicated by the broken line $S_0$. However, if the drain bias currents of these FET's are lowered from $I_0$ to $I_A$ as a result of operating potential fluctuations, then a step is formed in the composite characteristic curve $S_0$ at zero drain current. This step results in the introduction of crossover distortion in the push-pull amplifier output.

In accordance with the present invention, this problem of variation in the drain bias current of the FET, as well as the problem of crossover distortion in a class-AB push-pull amplifier are avoided by varying the DC bias voltage applied to the FET gate electrode to compensate such operating potential fluctuations. For example, and with respect to the graphical representation of FIG. 4, if the operating potential is subjected to a negative change so as to be decreased to the value $V'_{DD}$ thereby to decrease the drain current from $I_0$ to $I_A$, then the gate voltage should be changed from $V_{G0}$ to $V_{GA}$. It is seen that this change in the gate voltage results in the current-voltage characteristic curve associated therewith to intersect the shifted load line at the point O'. At this operating point, the drain current is seen to be equal to the quiescent level $I_0$. Conversely, if the operating potential is subjected to a positive change so as to be increased to the value $V''_{DD}$, then the gate voltage should be increased to the value $V_{GB}$. It is seen that the current-voltage characteristic curve associated with this increased gate voltage intersects the shifted load line at the point O''. At this operating point, the drain bias current is equal to $I_0$.

Therefore, it is appreciated that the present invention proceeds upon the principle of varying the FET gate voltage as a function of fluctuations in the FET operating potential so as to maintain the quiescent drain bias current notwithstanding such fluctuations. Hence, the FET bias current is stabilized.

Figure 6:
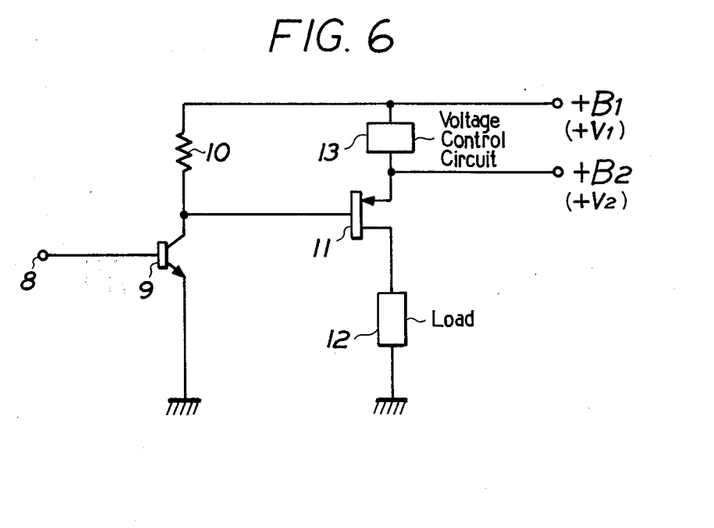
FIG. 6 is a schematic diagram of one embodiment of a transistor amplifier in accordance with the teachings of this invention.

One embodiment of a transistor amplifier which is capable of carrying out the principles of this invention is schematically illustrated in FIG. 6. This embodiment of the amplifier is comprised of an FET 11 having triode-type dynamic characteristics and a transistor, such as a bipolar transistor, 9. As shown, the source and drain electrodes of the FET 11 are connected through a load impedance 12 across a power supply $B_2$ capable of producing an operating potential $+V_2$. In the illustrated circuit, one terminal of the power supply is assumed to be connected to a reference potential, such as ground.

The gate electrode of the FET 11 is coupled to one of the output electrodes, for example, the collector electrode, of the transistor 9. The other output electrode of the transistor is connected to ground to thus establish a common emitter configuration. The collector electrode of the transistor is further connected through a collector load resistor 10 to another power supply $B_1$ which is capable of producing an operating potential $+V_1$. The base electrode of the transistor functions as an input, or control, electrode and is coupled to an input terminal 8 for receiving an input signal to be amplified. In one example of the illustrated embodiment, the power supply $B_1$ is selected to produce a higher potential $+V_1$ than the potential $+V_2$ produced by the power supply $B_2$. Accordingly, the gate-source voltage of the FET 11 is of positive polarity.

In accordance with this invention, a voltage control circuit 13 is provided to compensate for voltage fluctuations of the power supply $B_2$, so as to maintain the FET drain bias current at a substantially constant value. The voltage control circuit 13 is diagrammatically shown as being coupled to both power supplies $B_1$ and $B_2$ and as will be described, is adapted to respond to a voltage fluctuation $\Delta V_2$ in the power supply $B_2$ to cause a proportional change $\Delta V_1$ in the operating potential derived from the power supply $B_1$, which results in a corresponding modification $\Delta V_G$ in the FET gate voltage. Hence, the voltage control circuit serves to inject a portion of the voltage fluctuation $\Delta V_2$ of the power supply $B_2$ into the gate electrode of the FET 11. It will be seen that the voltage fluctuation $\Delta V_2$ of the power supply $B_2$ causes the drain bias current of the FET 11 to be changed to $\Delta I_D$, as previously described with reference to FIG. 4.

The FET 11 has an amplification constant $\mu$ which defines the relationship between the gate and source voltages of the FET. More particularly, for the embodiment depicted in FIG. 6 wherein the FET 11 is in grounded source, or drain follower, configuration, the relationship between a change in the gate voltage $\Delta V_G$ and a change in the source voltage $\Delta V_S$, the latter being equal to the fluctuaton $\Delta V_2$ in the power supply $B_2$ can be expressed as:

$$\frac{\Delta V_G}{\Delta V_S} = \frac{\Delta V_G}{\Delta V_2} = 1 + \frac{1}{\mu}$$

It is apparent that if the FET gate voltage can be controlled so as to change by the amount represented in equation (1) when the power supply $B_2$ varies, then the drain bias current will remain substantially constant. The voltage control circit 13, as will be described, senses the fluctuations $\Delta V_2$ and causes the operating potential derived from the power supply $B_1$ to vary in the manner represented by equation (1). This, of course, results in a corresponding change $\Delta V_G$ in the FET gate voltage.

Figure 7:
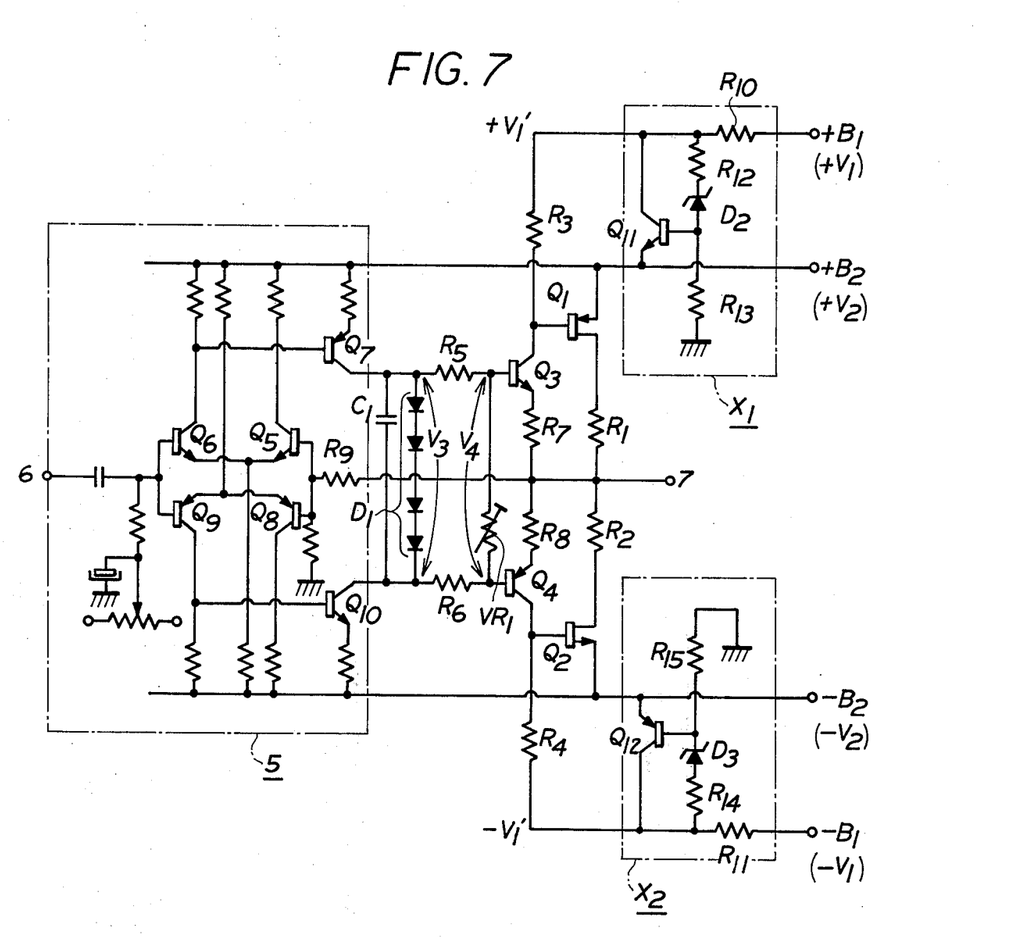
FIG. 7 is a schematic diagram of another embodiment of a transistor amplifier in accordance with the teachings of the present invention.

Referring now to FIG. 7, a class-B or -AB push-pull amplifier incorporating the embodiments of the present invention previously described with reference to FIG. 6 is illustrated. The push-pull amplifier is driven by a class-A amplifier stage 5 having an input terminal 6 which is adapted to be supplied with an input signal to be amplified. As one example thereof, the class-A amplifier comprises a first differential amplifier formed by differentially-connected transistors $Q_6$ and $Q_5$ having their respective collector electrodes connected through resistors to one terminal of the power supply $B_2$. As shown, these transistors have their emitter electrodes connected in common and through a resistor to a terminal of a power supply $-B_2$. It is appreciated that the power supply terminals may be the positive and negative terminals of a DC supply.

The amplifier stage 5 is further comprised of another differential amplifier formed by the differentially connected transistors $Q_9$ and $Q_8$ having their respective collector electrodes coupled through resistors to the power supply terminal $-B_2$. The emitter electrodes of these transistors are connected in common through a resistor to the terminal of the power supply $+B_2$. As illustrated, the base electrode of the transistor $Q_9$ is connected in common with the base electrode of the transistor $Q_6$ so as to receive an input signal applied to the terminal 13. Also, the base electrode of the transistor $Q_8$ is connected in common to the base electrode of the transistor $Q_5$ so as to receive a negative feedback from the push-pull amplifier output.

An input bias circuit having variable input impedance is connected to the common-connected base electrodes of the transistors $Q_6$ and $Q_9$. A suitable DC voltage is applied to this bias circuit across the variable impedance to thus form a variable bias source for the differential amplifiers.

The output of the differential amplifier formed of the transistors $Q_5$ and $Q_6$ is derived from the collector electrode of the latter transistor and is supplied through a transistor $Q_7$ to the push-pull output amplifier. The transistor $Q_7$ is complementary to the differentially-connected transistors $Q_5$ and $Q_6$ and acts as a current source to supply the push-pull output amplifier. Similarly, the output of the differential amplifier formed of the transistors $Q_8$ and $Q_9$ is derived from the collector electrode of the latter transistor and is coupled through a transistor $Q_{10}$ to the push-pull output amplifier. The transistor $Q_{10}$ is of a conductivity type which is complementary to the differentially-connected transistors, and it too acts as a current source.

A string of series-connected diodes $D_1$ interconnects the collector electrodes of the transistors $Q_7$ and $Q_{10}$ and is adapted to provide a reference voltage $V_3$ thereacross. These diodes are poled such that they are conductive when the collector voltage of the transistor $Q_7$ exceeds the collector voltage of the transistor $Q_{10}$. A capacitor $C_1$ is connected in parallel with the diodes $D_1$ to provide a bypass between the transistors $Q_7$ and $Q_{10}$ to eliminate noise which might appear at the diodes.

A resistor $R_5$ serves to couple the collector electrodes of the transistor $Q_7$ to the base electrode of a transistor $Q_3$, the latter transistor serving as an input stage for the push-pull output amplifier. Similarly, a resistor $R_6$ serves to couple the collector electrode of the transistor $Q_{10}$ to the base electrode of a transistor $Q_4$, the latter transistor being complementary to the transistor $Q_3$ and serving as a complementary input stage to the push-pull output amplifier. A variable resistor $VR_1$, such as a potentiometer, rheostat, or the like, interconnects the respective base electrodes of the transistors $Q_3$ and $Q_4$ and, as will soon be described, permits an adjustment to the input bias potentials supplied to the push-pull amplifier.

The push-pull output amplifier is seen to be a power amplifier having complementary stages disposed in push-pull configuration. Each of these stages is similar to the embodiment of the transistor amplifier of this invention which has been described previously with respect to FIG. 6. Thus, the output of one complementary stage is comprised of the FET $Q_1$ having triode-type dynamic characteristics and connected to an output terminal 7 through a current detector resistor $R_1$ in drain follower configuration. The output of the other complementary stage is comprised of the FET $Q_2$ having triode-type dynamic characteristics and connected to the output terminal 7 through a current detector resistor $R_2$ in drain follower configuration. The resistance values of the resistors $R_1$ and $R_2$ are on the order of about one ohm and may be included in a protection circuit, not shown. It is appreciated that the FET's $Q_1$ and $Q_2$ are complementary. As in the FIG. 6 embodiment, the FET $Q_1$ is, for example, of the P-channel type having its source electrode connected to the power supply $+B_2$. The gate electrode of this FET is DC coupled to the collector electrode of the transistor $Q_3$ which is of a complementary conductivity type. The collector electrode of the transistor $Q_3$ is further connected through a collector load resistor $R_3$ and through a voltage control circuit $X_1$ to the terminal of the power supply $+B_1$. The emitter electrode of the transistor is connected through a resistor $R_7$ to the ouput terminal 7.

The complementary stage of the push-pull amplifier is similarly connected, whereby the collector electrode of the transistor $Q_4$ is DC coupled to the gate electrode of the FET $Q_2$ and is further connected through a collector load resistor $R_4$ and through a voltage control circuit $X_2$ to the terminal of the power supply $-B_1$. As shown, the emitter electrode of the transistor $Q_4$ is connected through a resistor $R_8$ to the output terminal 7.

Although not shown, it should be fully appreciated that a load impedance is adapted to be connected to the output terminal 7 to be driven by the illustrated amplifier. Typically, for the application wherein the amplifier is used as a high quality audio amplifier, a loudspeaker system may be connected to the output terminal.

The output voltage supplied to the output terminal 7 by the push-pull amplifier is fed back to the amplifier stage 5 by a negative feedback circuit including the resistor $R_9$. As illustrated, the resistor $R_9$ is connected in common to the transistors $Q_5$ and $Q_8$ of the aforedescribed differential amplifiers.

The input bias voltage supplied to the push-pull amplifier by the transistors $Q_7$ and $Q_{10}$ of the amplifier stage 5 will result in a voltage $V_3$ across the diodes $D_1$ which is substantially equal to the sum of the diode voltage drops. The resistors $R_5$, $VR_1$ and $R_6$ form a voltage divider circuit connected across the diodes $D_1$ resulting in a divided voltage equal to $V_4$ across the variable resistor $VR_1$. This voltage $V_4$ is sufficient to bias the transistors $Q_3$ and $Q_4$ into conduction such that substantially equal currents flow therethrough and the transistors exhibit a base-emitter voltage drop equal to $V_{BE}$. Assuming negligible base current, it is seen that the collector currents of these respective transistors are equal to the emitter currents thereof which can be expressed as $$I = \frac{V_4 - 2V_{BE}}{R_7 + R_8}$$

Since the bias voltage $V_4$ is a divided fraction of the voltage $V_3$, it is recognized that $V_4$, and thus the collector currents of the transistors $Q_3$ and $Q_4$, can be readily adjusted merely by adjusting the variable resistor $VR_1$. Therefore, since the respective gate voltages applied to the FET's $Q_1$ and $Q_2$ are equal to the collector voltages of the transistors $Q_3$ and $Q_4$, it is appreciated that the operating points of the FET's can be established for class-B or class-AB operation by suitable adjustment of the transistor collector currents in the manner just described.

The distortion which would otherwise be introduced into the amplifier output signal provided at the output terminal 7 after amplification of an input signal applied to the input terminal 6 by reason of fluctuations in the power supplies $+B_2$ and $-B_2$ are avoided by reason of the voltage control circuits now described. The voltage control circuits $X_1$ and $X_2$ are substantially similar and function to control the output potentials $+V'_1$ and $-V'_1$ derived from the power supplies $+B_1$ and $-B_1$, respectively, in response to fluctuations in the power supplies $+B_2$ and $-B_2$. Consequently, the voltage control circuits $X_1$ and $X_2$ correct the shifting of the operating points of the FET's $Q_1$ and $Q_2$ caused by the output voltage fluctuations of the power supplies $+B_2$ and $-B_2$ as described with reference to FIG. 4. In the illustrated embodiment, the voltage control circuit $X_1$, for example, includes a resistor $R_{10}$ connected in series between the power supply terminal $+B_1$ and the collector load resistor $R_3$. A control transistor $Q_{11}$ has its collector-emitter circuit connected between the power supply terminal $+B_1$ and the power supply terminal $+B_2$. A series circuit formed of resistors $R_{12}$, $R_{13}$ and a constant voltage diode $D_2$, such as a zener diode, is connected between the power supply $+B_1$ and ground and is adapted to determine a base potential for the transistors $Q_{11}$. The voltage control circuit $X_2$ is substantially similar to the circuit $X_1$ and is of an opposite conductivity type. In the interest of brevity, the circuit $X_2$ will not be described in detail.

Although voltage control circuits $X_1$ and $X_2$ are shown as being disposed in series between the power supplies $+B_1$ and $-B_1$ and the collector load resistors $R_3$ and $R_4$, respectively, to change the output voltages $+V'_1$ and $-V'_1$ derived from the power supplies, it should be noted that the voltage control circuits may be included within the power supplies themselves so as to directly control the output voltages $+V_1$ and $-V_1$ produced thereby.

In operation, if no input signal is applied to the signal input terminal 6, the collector-emitter current flowing through the transistors $Q_3$ and $Q_4$ is nearly equal to $(V_4 - 2V_{BE})/(R_7 + R_8)$, as previously described. Accordingly, the voltage $V_4$ or the quiescent collector-emitter current can be adjusted, as desired, by suitably determining the resistance of the variable resistor $VR_1$. As one example, if the voltage $V_4$ is established such that the transistors $Q_3$ and $Q_4$ operate in class-A manner, the collector load resistances $R_3$ and $R_4$, the output voltages $+V_2$ and $-V_2$ produced by the power supplies $+B_2$ and $-B_2$; and output voltages $+V_1$ and $-V_1$ produced by the voltage control circuits $X_1$ and $X_2$ may be so determined that the FET's $Q_1$ and $Q_2$ are biased to operate in class-AB or class-B. The setting of the operating point of the transistors $Q_3$ and $Q_4$, i.e., the setting of the transistor base bias and the setting of FET gate-source bias are effected simultaneously by the adjustment of the variable resistor $VR_1$.

It may be noted that, immediately after the power supplies $B_1$ and $B_2$ have been switched on, the voltage $V_3$ across the diodes $D_1$ rises at a rate determined by the time constant of capacitor $C_1$. At this time, the collector currents of the transistors $Q_3$ and $Q_4$, and thus the voltage drops across the collector load resistances $R_3$ and $R_4$, are small. Hence, the gate potentials applied to the FET's $Q_1$ and $Q_2$ will be higher than the output voltage $V_2$ produced by the power supply $B_2$. As the voltage $V_3$ rises, the gate potentials change in a direction that tends to cut off the FEt's, i.e., toward increasing the biasing voltage across the gate and source electrodes. Since the FEt's have triode-type dynamic characteristics in which the drain current does not saturate, the FET's do not break down because of overcurrent. Even when the transistors $Q_3$ and $Q_4$ are turned off at the time of switching on the power supplies so that a voltage $V'_1 - V_2$ is applied across the gate and source electrodes of the FET's $Q_1$ and $Q_2$; the FET's require a relatively small breakdown voltage across the gate and source.

Let it be assumed that the voltage $+V_2$ of the power supply $+B_2$ exhibits a voltage fluctuation. If the gate-source voltage of the FET $Q_1$ is $V_{GS}$, the gate-drain voltage is $V_{GD}$, and the pinch-off voltage is $V_P$, then DC analysis of the FET yields the following relation:

$$V'_1 = V_2 + 2V_P \qquad (1)$$

In general, field effect transistors can be described by the following relation:

$$dV_{GS}/dV_{DS} = 1/\mu \qquad (2)$$

where $\mu$ is the voltage amplification factor of the field effect transistor, $V_{GS}$ is the voltage across the gate and source electrodes, and $V_{DS}$ is the voltage across the drain and source electrodes.

Also, in the FIG. 7 embodiment, the relation between $V'_1$ and $V_2$ can be expressed as:

$$V'_1 = V_2 + V_{GS} + I_C \cdot R_3 \qquad (3)$$

where $I_C$ is the collector current of the transistor $Q_3$. It is recalled that the collector current $I_C$ is substantially constant by reason of the biasing circuit connected to the transistor $Q_3$, and thus the product $I_C \cdot R_3$ is constant. Therefore, if equation (3) is differentiated with respect to $V_2$ and equation (2) is used, the following relation between $V'_1$ and $V_2$ is derived:

$$\frac{dV'_1}{dV_2} = 1 + \frac{dV_{GS}}{dV_2} = 1 + \frac{1}{\mu} \qquad (4)$$

Now, if the forward voltage $V_{BE}$ across the base and emitter of the transistor $Q_{11}$ is neglected, and if it is assumed that the change in the output voltage $+V'_1$ derived by the voltage control circuit $X_1$ is very small with respect to variations in output voltage $+V_2$, then circuit analysis of the voltage control circuit $X_1$ results in the following relation between $V'_1$ and $V_2$:

$$V'_1 = V_2 \cdot \frac{R_{12} + R_{13}}{R_{13}} + V_z = V_2 + (\frac{R_{12}}{R_{13}} V_2 + V_z) \qquad (5)$$

where $V_z$ is the voltage across the constant voltage diode $D_2$. To stabilize the DC bias current flowing through the FET $Q_1$ regardless of fluctuations in the output voltage $+V_2$, equations (1) and (5), and equations (4) and (5) have to be satisfied simultaneously. If equation (1) is substituted into equation (5), the following is obtained:

$$R_{12}/R_{13} \cdot V_2 + V_z = 2V_P \qquad (6)$$

If equation (5) is differentiated with respect to $V_2$ and equation (4) is substituted, the result is:

$$\frac{dV'_1}{dV_2} = \frac{R_{12} + R_{13}}{R_{13}} = 1 + \frac{1}{\mu} \qquad (7)$$

which can be rewritten as:

$$\Delta V'_1 = \Delta V_G = (1 + 1/\mu)\Delta V_2 \qquad (7')$$

Therefore, if $R_{12} \ll R_{13}$, then the following relation holds:

$$\frac{R_{12}}{R_{13}} = \frac{1}{\mu} \qquad (8)$$

Thus, when the output voltage $+V_2$ of the power supply $+B_2$ is of a predetermined value, if the resistances $R_{12}$, $R_{13}$ and the voltage $V_z$ across the constant-voltage diode $D_2$ are so selected that the above equations (6) and (8) hold simultaneously, then even if the drain-source voltage of the FET $Q_1$ is changed by fluctuations in the output voltage $+V_2$, the gate potential $V_G$ of the FET is corrected by the factor $(1 + 1/\mu)$ of the fluctuation, thereby maintaining the FET operating point at a predetermined value. The foregoing operation is attained for the alternative embodiment wherein an emitter follower stage is connected between the transistor $Q_3$ and the gate electrode of the FET $Q_1$.

The operation of the voltage control circuit $X_2$ proceeds upon the same principle as described above and can be similarly analyzed. Therefore, as this operation now is fully understood, further description thereof is not necessary.

Now, if an input signal to be amplified is applied to the input terminal 6, this signal is amplified by the amplifier stage 5 and then is supplied by the transistors $Q_7$ and $Q_{10}$ to the push-pull output amplifier stage. Further amplification is effected by the transistors $Q_3$ and $Q_4$ which drive the FET's $Q_1$ and $Q_2$. It is appreciated that the FET's now can drive a suitable load connected to the terminal 7 with minimal distortion, notwithstanding fluctuations in the power supplies $+B_2$ and $-B_2$.

In the illustrated embodiment, it is appreciated that each of the power supplies may be comprised of individual energizing sources. Alternatively, a single voltage source having positive and negative output terminals and a center tap connected to ground may be used to supply the voltages $+V_2$ and $-V_2$; and, similarly, a single voltage source having positive and negative output terminals and a center tap connected to ground may be used to supply the voltages $+V_1$ and $-V_1$. It is recognized that the particular configuration of such voltage source and source of operating potential may be selected as desired.

Figure 8:
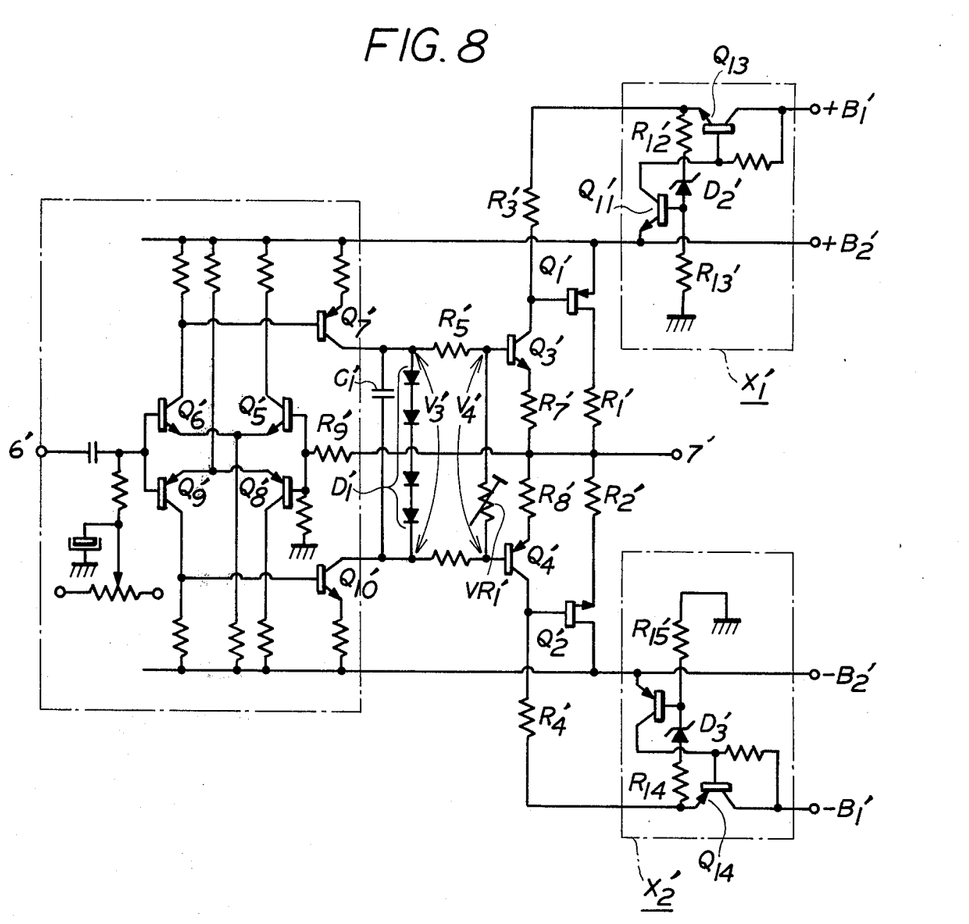
FIG. 8 is a schematic diagram of a still further embodiment of a transistor amplifier in accordance with the teachings of the present invention.

Another embodiment of a transistor amplifier which is capable of carrying out the principles of this invention is schematically illustrated in FIG. 8. This embodiment is similar to the previously described embodiment shown in FIG. 7 and like component parts are identified with corresponding reference numerals having an additional prime. The FIG. 8 embodiment differs from the FIG. 7 embodiment in that the voltage control circuits $X'_1$ and $X'_2$ include regulating transistors $Q_{13}$ and $Q_{14}$ in place of the resistors $R_{10}$ and $R_{11}$, respectively. The internal resistances of the transistors $Q_{13}$ and $Q_{14}$ are controlled by the collector currents of the transistors $Q_{11}$ and $Q_{12}$. In the embodiment, the output impedances of the voltage control circuits $X'_1$ and $X'_2$ are reduced and the utility factor of the power supplies $+B_1$ and $-B_1$ is improved. That is, the power supplies are used more efficiently. The operation of the voltage control circuits $X'_1$ and $X'_2$ is substantially similar to the aforedescribed operation of the FIG. 7 embodiment. Accordingly, in the interest of brevity, further description thereof is omitted.

In view of the foregoing explanation, it should be appreciated that the present invention functions such that the voltage control circuits X serve to control the voltages $V'_1$ derived from the power supply $B_1$ to vary the gate voltages applied to the FET's in the event that the power supply $B_2$ is subjected to voltage fluctuations. Accordingly, drift of the operating point of the FET's which otherwise would arise because of variations in the FET source voltage is effectively offset, and the DC bias current flowing through each FET is stabilized. Therefore, it is seen that if the FET's are used to drive a loudspeaker system, the large currents which are drawn by loudspeakers usually will result in developing variations in the output voltage produced by the power supply $B_2$, and if the power supply $B_2$ is used to energize plural channels, such voltage variations produce crosstalk modulation in the various channels. But the use of the voltage control circuits of the present invention prevents such interchannel interference.

Furthermore, whereas voltage fluctuations in the power supply $B_2$ can be minimized by other regulating circuitry to thus stabilize the FET bias currents, the fact that this power supply should have a high current capacity results in complex and expensive regulators. This is accompanied by an increase in power losses due to heat. On the other hand, the power supply $B_1$ usually has a small current capacity. Accordingly, the present invention achieves FET bias current stabilization with a simple, inexpensive circuit and with minimal power losses.

Also, since the biasing circuit which is used to adjust the operating points of the transistors $Q_3$ and $Q_4$ simultaneously functions to establish the operating points of the FET's $Q_1$ and $Q_2$, a relatively simple bias circuit can be constructed. This means that bias adjustment for the FET's can be carried out easily and expeditiously.

Moreover, although the FET gate bias can be stabilized with respect to temperature changes by the use of relatively large emitter resistors for the transistors $Q_3$ and $Q_4$, this is counteracted by using much larger collector reistors to increase the gain of these transistors. If large resistors are thus employed, the power supply $B_1$ must be designed with a sufficiently high output voltage capacity. But, since the present invention utilizes independent power supplies $B_1$ and $B_2$, the high voltage requirements of $B_1$ can be attained without affecting the high current requirements of $B_2$.

While the present invention has been particularly shown and described with reference to a plurality of preferred embodiments thereof, it should be fully understood that various changes and modifications in form and details are contemplated. For example, the conductivity types of the respective transistors, as well as the FET's, can be suitably changed, as desired. Also, the FET's may operate in other conventional classes of operation and need not be limited solely to the class-AB or -B modes of operation. Furthermore, if employed in push-pull configuration, it is appreciated that the amplifier stage 5 which drives the push-pull stage can be of any desired construction and need not be limited solely to the illustrated embodiments. The particular type of coupling between elements can be DC, if desired, or AC signal coupling can be used. Also, it is recognized that the particular applications for the teachings of the present invention admit of wide usage and need not be limited solely to audio amplifiers.

It is therefore intended that the appended claims be interpretated as including all such changes and modifications in form and details which may be made without departing from the spirit and scope of the present invention.

What is claimed is:

1. A transistor amplifier comprising:
    a transistor having an input electrode for receiving an input signal and first and second output electrodes;
    a field effect transistor having triode-type dynamic characteristics, the gate electrode of said field effect transistor being coupled to one output electrode of said transistor for receiving a voltage and the source and drain electrodes of said field effect transistor being connected to a load impedance;
    power supply means including first means for supplying a first operating voltage to said one output electrode of said transistor and second means for supplying a second operating voltage to said field effect transistor; and
    voltage control means coupled to said first and second means and responsive to fluctuations in said second operating voltage for causing said first operating voltage to change such that said voltage received by said gate electrode is correspondingly modified to thereby stabilize a bias current flowing through said field effect transistor, notwithstanding said second operating voltage fluctuations.

2. A transistor amplifier in accordance with claim 1 wherein said transistor and said field effect transistor are of opposite conductivity types and said field effect transistor is connected to said impedance in drain follower configuration.

3. A transistor amplifier in accordance with claim 1 wherein said first means is connected to said transistor one output electrode by a resistor such that said changes in said first operating voltage are applied to said gate electrode through said resistor.

4. A transistor amplifier in accordance with claim 1 wherein said voltage control means comprises means for causing said first operating voltage to change by an amount which is a function of the amplification constant of said field effect transistor.

5. A transistor amplifier in accordance with claim 4 wherein said last-mentioned means causes said first operating voltage to change $\Delta V_1$ in response to a fluctuation $\Delta V_2$ in said second operating voltage such that $\Delta V_1 = (1+1/\mu)\Delta V_2$, where $\mu$ is the amplification constant of said field effect transistor.

6. A transistor amplifier in accordance with claim 1 wherein said voltage control means comprises a control transistor having its collector-emitter circuit connected between said first and second means; and a bias circuit including a constant voltage source coupled to the base electrode of said control transistor and supplied with said first operating voltage.

7. A transistor amplifier in accordance with claim 6 wherein said bias circuit comprises a series circuit connected between said first means and a reference potential and including, in order, a first resistor, said constant voltage source and a second resistor; and wherein the ratio of the resistance values of said first and second resistors is equal to the reciprocal of the amplification constant of said field effect transistor.

8. A transistor amplifier in accordance with claim 6 wherein said voltage control means further comprises a regulating transistor having its collector-emitter circuit connected in series between said first means and said first-mentioned transistor to supply said first operating voltage.

9. A transistor amplifier in accordance with claim 1 wherein said transistor and said field effect transistor comprise one stage of a push-pull amplifier, said push-pull amplifier including a complementary stage comprised of:
    a second transistor having an input electrode for receiving an input signal and first and second output electrodes;
    a second field effect transistor having triode-type dynamic characteristics, the gate electrode of said second field effect transistor being coupled to one output electrode of said second transistor for receiving a voltage and the source and drain electrodes of said second field effect transistor being connected to said load impedance;
    third means for supplying a third operating voltage to said one output electrode of said second transistor and fourth means for supplying a fourth operating voltage to said second field effect transistor; and
    second voltage control means coupled to said third and fourth means and responsive to fluctuations in said fourth operating voltage for causing said third operating voltage to change such that said voltage received by said second field effect transistor gate electrode is correspondingly modified to thereby stabilize a bias current flowing through said second field effect transistor, notwithstanding said fourth operating voltage fluctuations.

10. A transistor amplifier comprising:
first and second voltage sources each having a pair of terminals;
first and second transistors having base electrodes supplied with an input signal to be amplified, collector electrodes coupled to respective terminals of said first voltage source through first and second impedances, and emitter electrodes connected to each other;
first and second field effect transistors each having triode-type dynamic characteristics, and including source electrodes connected to respective terminals of said second voltage source, gate electrodes connected to respective collector electrodes of said first and second transistors, and drain electrodes connected to each other and to a reference potential through a load;
first voltage control means connected between one terminal of said first voltage source and one terminal of said second voltage source to inject a portion of a voltage fluctuation of said second voltage source through said first impedance into the gate electrode of said first field effect transistor to stabilize a DC biasing current flowing through said first field effect transistor notwithstanding the voltage fluctuation of said second voltage source; and
second voltage control means connected between the other terminal of said first voltage source and the other terminal of said second voltage source to inject a portion of a voltage fluctuation of said second voltage source through said second impedance into the gate electrode of said second field effect transistor to stabilize a DC biasing current flowing through said second field effect transistor notwithstanding the voltage fluctuation of said second voltage source.

11. A transistor amplifier according to claim 10, wherein the voltage injected into said gate electrode of said first field effect transistor is equal to $\Delta V_{G1}$ in response to a voltage fluctuation appearing at said one terminal of said second voltage source equal to $\Delta V_2$, and wherein the voltage injected into said gate electrode of said second field effect transistor is equal to $\Delta V_{G2}$ in response to a voltage fluctuation appearing at said other terminal of said second voltage source equal to $\Delta V'_2$, said injected voltages being defined in accordance with:

$$\Delta V_{G1} = (1 + 1/\mu 1)\Delta V_2$$

$$\Delta V_{G2} = (1 + 1/\mu 2)\Delta V'_2$$

wherein $\mu_1$ and $\mu_2$ are the amplification constants of said first and second field effect transistors, respectively.

12. A transistor amplifier according to claim 11 wherein said first and second transistors are of opposite conductivity and said first and second field effect transistors are complementary to said first and second transistor conductivities, respectively.

13. A transistor amplifier according to claim 11 wherein each of said first and second transistors is connected in grounded emitter configuration, and each of said first and second field effect transistors is connected in drain follower configuration.

14. A transistor amplifier according to claim 13 wherein the base electrodes of said first and second transistors are connected to a DC biasing circuit comprising:
a constant voltage source having a pair of terminals;
a voltage divider connected across the terminals of said constant voltage source and including a variable resistor; and
circuit means for supplying the voltage across said variable resistor to the base electrodes of said first and second transistors; whereby the corresponding DC biasing currents of said first and second transistors are adjustable in accordance with an adjustment of said variable resistor.

15. A transistor amplifier according to claim 14 wherein said constant voltage source comprises series connected diodes and current source means for supplying a current to said series connected diodes.

16. A transistor amplifier according to claim 15 further including a class-A amplifier for amplifying an input signal and for supplying the amplified signal to the base electrode of said first and second transistors in the same polarity.

17. A transistor amplifier according to claim 10 wherein each of said first and second voltage control means comprises:
a control transistor having its collector and emitter electrodes connected between corresponding terminals of said first and second voltage sources; and
a series circuit including, in order, a resistor, a constant voltage source and another resistor, the series circuit being connected between the reference point and a corresponding terminal of said first voltage source, the junction of said other resistor and said constant voltage source being connected to the base electrode of said control transistor; whereby the voltage fluctuations appearing at the corresponding terminal of said second voltage source are injected into the corresponding terminal of said first voltage source by a ratio determined by the resistance values of said resistor and said other resistor to stabilize the DC biasing currents flowing through said first and second field effect transistors, respectively.

18. A transistor amplifier according to claim 17 wherein the control transistors included in said first and second voltage control means are of opposite conductivity types.

19. A transistor amplifier according to claim 17 wherein the resistance values of said resistor and said other resistor included in said first and second voltage control means are in the ratios $1/\mu 1$ and $1/\mu 2$, respectively, $\mu_1$ and $\mu_2$ being the amplification constants of said first and second field effect transistors, respectively.

20. A transistor amplifier according to claim 17 wherein said constant voltage source comprises a zener diode.

21. A transistor amplifier according to claim 17 wherein each of said voltage control means further includes a regulating transistor having its collector and emitter electrodes connected in series with a corresponding terminal of said first voltage source and its base electrode connected to its collector electrode through a further resistor and to the collector electrode of said control transistor.

* * * * *